(12) United States Patent
Schmidt et al.

(10) Patent No.: US 6,232,561 B1
(45) Date of Patent: May 15, 2001

(54) PROCESS FOR PRODUCING WIRE CONNECTIONS ON AN ELECTRONIC COMPONENT ASSEMBLY CARRIER MADE BY THE PROCESS

(75) Inventors: Joachim Schmidt; Jens Sabotke; Frank-Dieter Hauschild, all of Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/015,033

(22) Filed: Jan. 28, 1998

(30) Foreign Application Priority Data

Jan. 31, 1997 (DE) ............................................... 197 03 639

(51) Int. Cl.⁷ ...................................................... H05K 1/16
(52) U.S. Cl. ........................ 174/260; 257/676; 257/692; 257/784
(58) Field of Search ............................ 174/260; 257/676, 257/669, 674, 780, 784, 692; 361/777

(56) References Cited

U.S. PATENT DOCUMENTS 4,415,115 * 11/1983 James ................................... 228/170
5,124,783 * 6/1992 Sawaya ................................ 257/724
5,365,409   11/1994 Kwon et al. .......................... 361/813
5,804,468 *  9/1998 Tsuji et al. ............................ 438/122

FOREIGN PATENT DOCUMENTS 34 47 345 A1   7/1985 (DE).
 4207198    *  9/1992 (DE).
58-210650   * 12/1983 (JP) ...................................... 257/676
 3-167872   *  7/1991 (JP) ...................................... 257/676
 5-243306   *  9/1993 (JP).

OTHER PUBLICATIONS

Patent Abstracts of Japan Vo. 005, No. 171 (E–080), Oct. 30, 1981 & JP 56 100436 A (Toshiba Corp.), Aug. 12, 1981.
Patent Abstract of Japan vol. 004, No. 079 (E–014), Jun. 7, 1980 & JP 55 046578 A (Toshiba Corp), Jul. 11, 1985.

* cited by examiner

Primary Examiner—Albert W. Paladini
(74) Attorney, Agent, or Firm—Michael J. Striker

(57) ABSTRACT

Electronic components on an assembly carrier are connected with conductor paths on the assembly carrier by welding a first ball-shaped end of a first wire to an electronic component, welding a first ball-shaped end of a second wire to the conductor path, and welding second broadened ends of both wires to a connection surface located between the electronic component and the conductor path.

4 Claims, 2 Drawing Sheets

PROCESS FOR PRODUCING WIRE CONNECTIONS ON AN ELECTRONIC COMPONENT ASSEMBLY CARRIER MADE BY THE PROCESS

BACKGROUND OF THE INVENTION

The present invention relates to a process for producing bond wire connections and an assembly carrier made by the process.

It is known to use a process to electrically connect the electronic components such as, for example, semiconductor chips, which are assembled on an assembly carrier on board with the conductor path frame of the assembly carrier or board. In this process, the connection of the chips is accomplished in a so-called ball-wedge-bonding process in which bonded wire is connected with connection surfaces (bond surfaces) to which the conductor paths are oriented. During the ball-wedge-bonding, the wire is guided by a capillary of the bonding head. A remote first end of the wire is melted, for example, via a signal discharge device and a ball is formed due to the outer surface tension of the melted end. A weld is then formed between the electronic component connection of an electronic component on the assembly carrier and the first end of the wire via a so-called thermal welding in which pressure, heat and ultrasound effects are applied during the lowering of the capillary onto the electronic component connection. Thereafter, the capillary is moved to the connection surface of a conductor path during which movement the wire is drawn out of the capillary.

During the lowering of the capillary a second end of the wire is applied to the connection surface of the conductor path and is widened out as it is applied by the action of the capillary rim there against the wedge as well as welded to the connection surface by the action of pressure, heat, and ultrasound effects of thermal welding. The second end of the wire is created as the wire is severed from the wire supply in the capillary during the wire end application process just described. A disadvantage arises with this known process, however, in that the creation of the second thermal weld connection involving widening out of the second end of the wire requires considerably more working space than the creation of the ball on the first end of the wire as it applied to the electronic component connection. The distance between adjacent electronic component connections can on a chip, for example, amount to only 80 μm while, in contrast, the width of the connection surfaces of the conductor paths must be chosen at some multiple greater than this distance, in order to permit sufficient working room to lower the bonding tool to the connection surface. For this reason, the matrix or arrangement of the connection surfaces associated with the conductor paths is relatively much larger than the matrix or arrangement of the electronic component connections and requires much more space on the assembly carrier. Moreover, it is disadvantageous that the space between the connection surfaces of the conductor paths and the electronic component connections are not otherwise available for use since the wires extend over the space.

SUMMARY OF THE INVENTION

The present invention, in one aspect thereof, provides a process for producing the electrical connections between the connections respectively associated with the electronic components and the conductor paths, whereby the required space for the wiring of the type used in a ball-wedge-bond process is considerably reduced, in that the connection surface for each second wire end is spaced from the conductor path at a location between the electronic component matrix and the conductor path matrix and is connected to the conductor path by a second wire. The process according to the present invention advantageously permits the ball shaped type of wire end, such as is formed for the first end of the wire, to be used for both the electronic component connections as well as the connection surfaces for the conductor paths. Since the bonding tool does not require but a relatively small working space for this type of wire end bonding process, the spacing of the conductor paths from one another can be correspondingly relatively narrow, such as, for example, along the scale of the spacing between the electronic component connections to each other—namely, 80 μm. At the same time, the conductor paths can be laid more densely on the assembly carrier and the wire lengths can be thereby shortened. The second ends of each respectively paired first and second wires are welded to a common connection surface which is spaced from the conductor paths and the electronic component connections. In this way, the space between the electronic component and the conductor path matrices can be advantageously used.

The process of the present invention provides the further advantage that the shortened bonding paths reduce the wire material demand, a consequence which produces considerable savings if gold bond wire is used. Moreover, the extent of process paths on the bonding head rendered unusable as a consequence of the bond wire production is clearly reduced. Since the process of the present invention uses two wires instead of a single wire to structure an electrical connection between an electronic component and a conductor path, the wire paths are relatively flatter, whereby the mechanical stability of the bond connections is increased.

In a situation in which the space requirements for the conductor path matrix need not be limited to the least space configuration but, in contrast, the working path of the bonding tool must be constrained to the smallest possible, it is advantageous, in accordance with a further aspect of the present invention, if only every other electronic component connection is connected via two wires to the respective associated conductor path and the remaining electronic component connections are each directly connected (via a single respective wire) with their respective associated conductor path connection surfaces.

The width of the connection surface of a conductor path can be advantageously chosen to be greater than the sum of the width of the associated conductor path and the spacings of the associated conductor path to its immediately adjacent conductor paths.

It is particularly advantageous if the connection surfaces of the conductor paths, in the space between the electronic components and the ends of the conductor paths, are arranged in several rows offset with respect to one another, as in this way the available unused space between the electronic component and the conductor path matrices is particularly effectively used.

BRIEF DESCRIPTION OF THE DRAWINGS

FIG. 1b is a schematic vertical sectional view of a bond connection of the prior art assembly carrier shown in 1a;

FIG. 2b is a schematic vertical sectional view of a bond connection between a conductor path and an electronic component of the assembly carrier shown in FIG. 2a.

DETAILED DESCRIPTION OF THE EMBODIMENTS

Figure 1A:
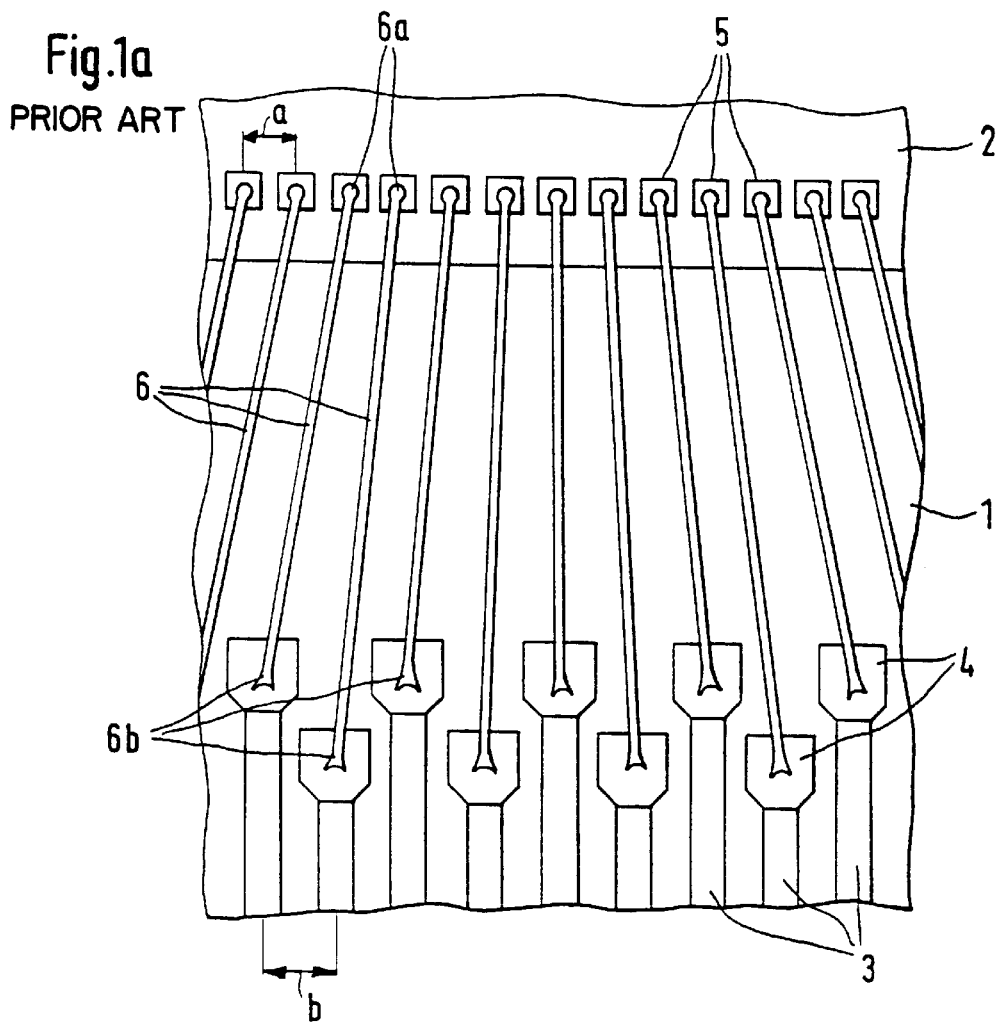
FIG. 1a is a perspective view of a portion of a prior art assembly carrier.

FIGS. 1a and a 1b shown an assembly carrier 1 which is representative of an assembly carrier of the prior art. Such an assembly carrier can, for example, be configured as a conductor plate or board or be a hybrid. On the topmost outer surface of the assembly carrier 1, there is provided at least one electronic component 2 which can be, for example, an integrated circuit. The electronic circuit 2 is adhesive to the assembly carrier or is otherwise affixed thereto by conventional means. On the top side of the integrated circuits facing away from the topmost outer surface of the assembly carrier I are located numerous connections 5, of which only several are shown in FIG. 1a. The connections are arranged on the integrated circuits in a relatively narrow matrix at a spacing of only 80 μm from one another. A matrix of the conductor paths 3 are arranged on the topmost outer surface of the assembly carrier 1 and the ends of the conductor paths are provided with connection surfaces 4, which are connected to the electronic component connections 5 by bond wires applied in a ball-wedge-bond process.

A bonding tool is used in the bond process and includes a capillary through which wire is guided, the capillary having a diameter dimensioned in accordance with the diameter of the wire. Gold wire is typically used as the bond wire. The end 6a of the wire guided out of the capillary is, for example, melted via the energy of a signal discharger, whereby the melt creates a ball by virtue of the over surface tension. During the lowering of the capillary on the electronic component connection 5, the end 6a of the bond wire 6 is produced by a weldment generated by pressure, heat and ultrasound effect. Thereafter, a bonding tool is moved to a connection surface 4 whereat the wire is guided out of the capillary. During renewed lowering of the capillary to the connection surface 4, the wire forms a hose shape. The capillary is now fully lowered onto the connection surface 4 and the wire is welded to the connection surface 4 via the thermal welding process. In this way, the capillary edge forms a conically shaped welding tool which acts to broaden out the end 6b of the bond wire onto the connection surface 4, weld it to the surface, and separate the drawn out wire from the wire supply in the capillary.

The just described process steps require sufficient working space for the bonding tool to operate on the connection surface 4 so that the connection surfaces 4 cannot be arranged as small as would be desired. The connection surfaces 4 are integrated into the conductor paths 3 so that now an electronic component connection 5 can be electrically connected with a conductor path 3 via a wire 6. As can be seen especially in FIG. 1a, the matrix of the connection surfaces 4 with the conductor paths 3 (at spacings b) must be relatively much wider than the matrix of the electronic component connections 5 (at spacings a). It is particularly not possible to configure the width of the connection surfaces 4 greater than the sum of the width of a respective conductor path 3 combined with the two side spacings to the respective two immediately adjacent conductor paths 3.

Figure 2A:
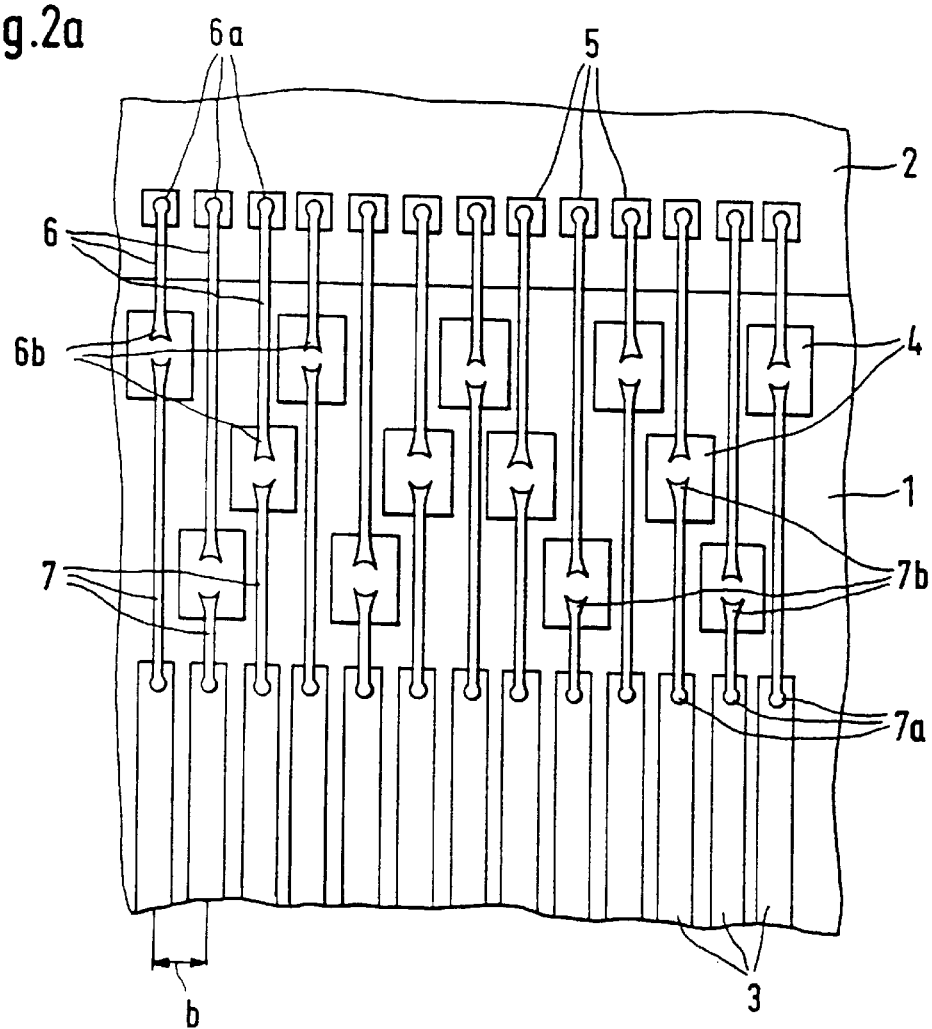
FIG. 2a is a top plan view of a portion of an assembly carrier produced according to the production process of the present invention.
Figure 2B:
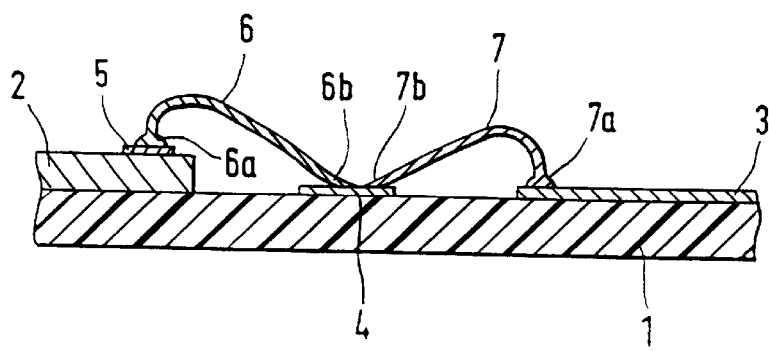

FIGS. 2a and 2b show an assembly carrier 1 produced in accordance with the process of the present invention although it is to be noted that these figures are provided merely to clarify important details of the invention and the scale and the portions such as, for example, the length of the wire, have been greatly simplified for clarity. The conductor paths from a matrix similar to the conductor path matrix shown in the prior art assembly carrier in FIG. 1a having a plurality of parallel conductor paths. The conductor paths 3 in the assembly carrier shown in FIG. 2a, however, are relatively more densely arranged relative to the electronic components 2. As shown, each electronic component connection 5 is connected by a wire 6 and a wire 7 to a conductor path 3. In this manner, the ball formed first end of a bond wire 6a is welded to a electronic component connection 5. Thereafter, a second end 6b of the wire 6 is welded to a connection surface 4. The connection surface 4, however, is not integrated into a conductor path 3 but is, instead, at a spacing from the respective conductor path 3 in region between the electronic components 2 and the matrix of the conductor path 3.

After the broadening out and welding of the end 6b of the wire 6, the bonding head is moved to a conductor path 3 preparatory for guiding a second wire into connection therewith. The conductor path 3 are arranged in a relatively narrow matrix on the assembly carrier such that the spacing from one conductor path 3 to an immediately adjacent conductor path 3 corresponds generally with the spacing a of the electronic component connections 5 of the electronic component 2 matrix. Such a spacing arrangement is possible because the width of a connection surface 4, as seen in FIG. 2a, can be equal to or greater than the sum of the width of a respective conductor path 3 combined with the two sides spacings to the respective two immediately adjacent conductor paths 3 without the undesirable consequence that the connection surfaces 4 overlap the conductor paths 3. It is also possible to configure the conductor path 3 matrix with a larger between or intraconductor path spacing b.

The ball nor ball shaped end 7a of a second wire 7 is now welded to a respective conductor path 3. This is easily accomplished as the creation of this weldment does not require any relatively large space on the conductor paths 3, in contrast to the space requirements to accomplish the weldment of the other end 7b of the second wire 7. Thus, the weldment of end 7a of the second wire 7 can be accomplished on relatively small conductor paths 3.

There now follows movement of the bonding tool to the respective associated connection surface 4 at which the weldment of the second end 7b of the second wire 7 is accomplished in a procedure by which the end is broadened out under pressure (a wedge bond). The remaining electronic component connections 5 are connected in similar manner to the remaining conductor paths 3 such that each conductor path 3 is connected through a respective associated connection surface 4 with a respective electronic component connection 5 via two wires 6, 7 extending to the connection surface 4. The wires 6 and 7 can thus be so guided that they are guided away from the connection surfaces 4 to which adjacent wires are welded. The connection surfaces 4 in the embodiment thus far described are preferably arranged in three rows in the region between the electronic components 2 and the conductor path 3 matrix so as to optimize the use of the available space.

The process of the present invention for electronically connecting the electronic components on an assembly carrier with conductor paths on the assembly carrier thus includes the steps summarized as follows. A step includes welding a first end of a first wire to an electronic component connection by a thermal welding process in which a ball shaped wire end is formed. Another step includes welding a second end of the first wire to a connection surface located immediately the electronic component connection and a respective conductor path to which the electronic component is to be electrically connected, the connection surface being at a spacing from the respective conductor path. A further step includes welding a first end of a second wire to the conductor path by a welding process in which a ball shaped wire end is formed and another step includes welding a second end of the second wire to the connection surface intermediate the electronic component connection and the conductor path by a welding process in which the wire end is broadened out and welded to the connection surface.

Figure 1B:
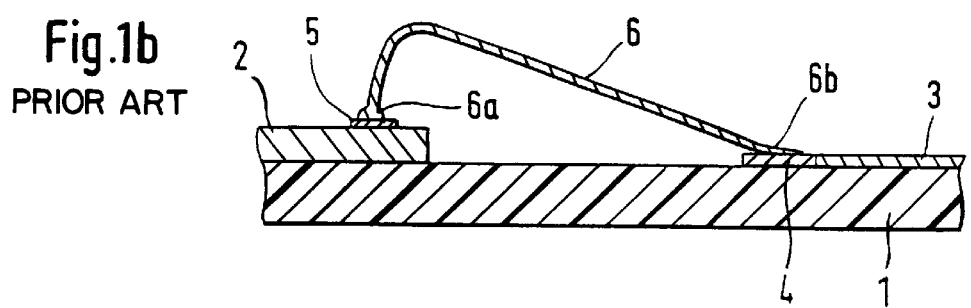

In another version of the assembly carrier produced in accordance with the process of the present invention, it is possible to connect every other electronic component 5 via wires 6, 7 with a conductor path 3 and to connect the remaining electronic component connections 5 directly with the remaining conductor paths 3 with single respective wires in accordance with the prior art connection process discussed with respect to the prior art assembly carrier shown in FIGS. 1*a* and 1*b*.

We claim:

1. An assembly comprising an assembly carrier; at least one electrical or electronic component arranged on the assembly carrier; conductor paths arranged on the assembly carrier; a plurality of connection surfaces located between the component and the conductor paths at a distance from the conductor paths; first wires connecting the connection surfaces with at least a part of the connections of the component; and second wires connecting connection surfaces with the conductor paths, so that a first end of one of the first wires is connected with one of the connections of the component, a first end of one of the second wires is connected with one of the conductor paths, while a second end of the same first wire and a second end of the same second wire are connected with one of the connection surfaces associated with the one conductor path, the first end of the one first wire being connected with the one connection of the component and the first end of the one second wire being connected with the one conductor path by first ball-shaped deforming each of the first ends and then welding each ball-shaped deformed first end to the one connection of the component and to the one conductor path correspondingly, the second end of the same first wire and the second end of the same second wire being connected to the one connection surface by broadening out of each second end and then welding each broadened out second end to the one connection surface, and the connection surfaces being arranged between the component and ends of the conductor paths in several rows with offset relative to one another and also being arranged in a common plane on assembly carrier.

2. An assembly according to claim 1, wherein every other connection of the component is connected with one of the connection surfaces which is directly connected to one of the conductor paths.

3. An assembly according to claim 1, wherein the first ends of the first wires and the second wires have bonding surfaces with a smaller width than bonding surfaces of the second ends of the first wires and the second wires.

4. An assembly according to claim 1, wherein each of the connection surfaces has a width which is greater than a sum of a width of an associated one of the conductor paths and both distances from the associated conductor path to neighboring ones of the conductor paths.

* * * * *